(12) United States Patent
Portnoi et al.

(10) Patent No.: US 6,219,369 B1
(45) Date of Patent: Apr. 17, 2001

(54) PHASED MATCHED SURFACE EMITTING DIODE LASER

(76) Inventors: Efim L. Portnoi, Apt. 28, building 3, 40 M. Toresa Street, 194223, St. Petersburg; Mikhail A. Kaliteevski, Apt. 67, 27/3 Golikova Street, 198262, St. Petersburg; Olga G. Sheremet, 2 Khlopina Street, 194064, St. Petersburg; Grigorii S. Sokolvskii, Apt. 179, 61 Lesnoi dt., 194100 St. Petersburg, all of (RU); John McKillop, 10 Meadow Ter., Saunderstown, RI (US) 02874

( * ) Notice: Subject to any disclaimer, the term of this patent is extended or adjusted under 35 U.S.C. 154(b) by 0 days.

(21) Appl. No.: 09/093,923

(22) Filed: Jun. 9, 1998

Related U.S. Application Data
(60) Provisional application No. 60/049,022, filed on Jun. 9, 1997.

(51) Int. Cl.[7] .................................................. H01S 3/08
(52) U.S. Cl. .................................. 372/96; 372/102; 372/45
(58) Field of Search .................................. 372/96, 102, 45

(56) References Cited

U.S. PATENT DOCUMENTS

| | | |
|---|---|---|
| 5,003,550 | 3/1991 | Welch et al. ............................ 372/50 |
| 5,040,187 | 8/1991 | Karpinski ............................... 373/50 |
| 5,238,531 | 8/1993 | Macomber et al. .................. 156/643 |
| 5,241,556 | 8/1993 | Macomber et al. .................... 372/96 |
| 5,345,466 | 9/1994 | Macomber ................................ 372/7 |
| 5,610,930 | 3/1997 | Macomber et al. .................... 372/36 |
| 5,617,436 * | 4/1997 | Lo ........................................... 372/45 |

* cited by examiner

*Primary Examiner*—Theresa M. Arroyo
*Assistant Examiner*—Davienne Monbleau
(74) *Attorney, Agent, or Firm*—Perman & Green, LLP

(57) ABSTRACT

A laser cavity is defined by gratings which are selected to provide distributed feed back within the cavity oscillating at a predetermined wavelength. At least one of the gratings deflects a portion of the light wave at an angle to the plane of the active layer to provide surface emission of the laser beam. In order to enhance the output of the laser cavity a further grating is provided on the side of the active layer opposite to the first gratings.

2 Claims, 2 Drawing Sheets

PHASED MATCHED SURFACE EMITTING DIODE LASER

This application claims the benefit of U.S. Provisional Application No. 60/049,022 filing date Jun. 9, 1997.

BACKGROUND OF THE INVENTION

A major portion of recent development efforts in laser diodes have focused on increasing the power output available for applications such as solid state laser pumping or materials processing. Although some success has been achieved, the power output of diode lasers remains limited, primarily by the heat generated and the degradation of the output window. In general these problems are approached by attempting to improve laser efficiency and by enlarging the output window, but conventional semiconductor laser designs appear to have largely reached the limits of these improvements. It is the purpose of this invention to provide a unique laser diode structure having both enhanced efficiency and higher output power.

A typical diode laser consists of an assembly of layers of semiconductor materials which form a junction at their interface. On one side of the junction there is a relative absence of electrons (p) and at the other side of junction there is a relative excess of electrons (n). An electrical potential is applied across the junction to initiate (pump) electrons across the junction. With certain materials, the electron migration produces a population inversion, during which energy is released in the form of photons. The photons may be processed within a variety of elements of the laser diode and emitted as a laser beam. The region which comprises the junction is called the active layer and is defined by the so called p and n materials. In order to sustain and enhance the population inversion, the active region is limited by reflective elements which contain the photons within a portion of the active region called the laser cavity. These reflective elements vary in the degree of reflectivity to provide feedback of a percentage of the photons to the laser cavity and to transmit a portion of the incident photons from an edge of the diode or from the surface of the diode in a coherent laser beam.

The use of diodes having an edge emitting characteristic is limited because of the physical area available for the output window. On the other hand, the surface emitting diode is not so restricted and it is a purpose of this invention to make use of a surface emitting diode configuration in an enhanced power design.

In order to provide sufficient feedback and to deflect the laser light through the surface of the semiconductor, the active layer is confined between gratings having predetermined indexes of refraction. The gratings provide distributed feedback within the active layer and at least one of the gratings is defined to allow the transmission (coupling) of light in a deflected angle to a window which may be etched in the semiconductor surface. A laser cavity is formed generally within the active layer by the path of the current flow through the region. Therefore, by adjusting the conductivity of certain regions of the semiconductor, the current flow path, i.e., the laser cavity, may be defined advantageously.

SUMMARY OF THE INVENTION

It is the purpose of this invention to construct a laser diode having a laser cavity defined by gratings which are selected to provide distributed feed back within the cavity oscillating at a predetermined wavelength. At least one of the gratings deflects a portion of the light wave at an angle to the plane of the active layer to provide surface emission of the laser beam. In order to enhance the output of the laser cavity a further grating is provided on the side of the active layer opposite to the first gratings. This grating is a Distributed-Bragg-Reflector and is positioned to diffract light in alignment with and matching in phase the output of the laser cavity. In this manner the output beam is distributed over a relatively large window, while the output power is increased through the higher efficiency provided by the phased matched Bragg-Reflector.

DESCRIPTION OF THE DRAWINGS

The invention of this application is described in more detail below with reference to the Drawing in which.

DESCRIPTION OF THE PREFERRED EMBODIMENT

Figure 1:
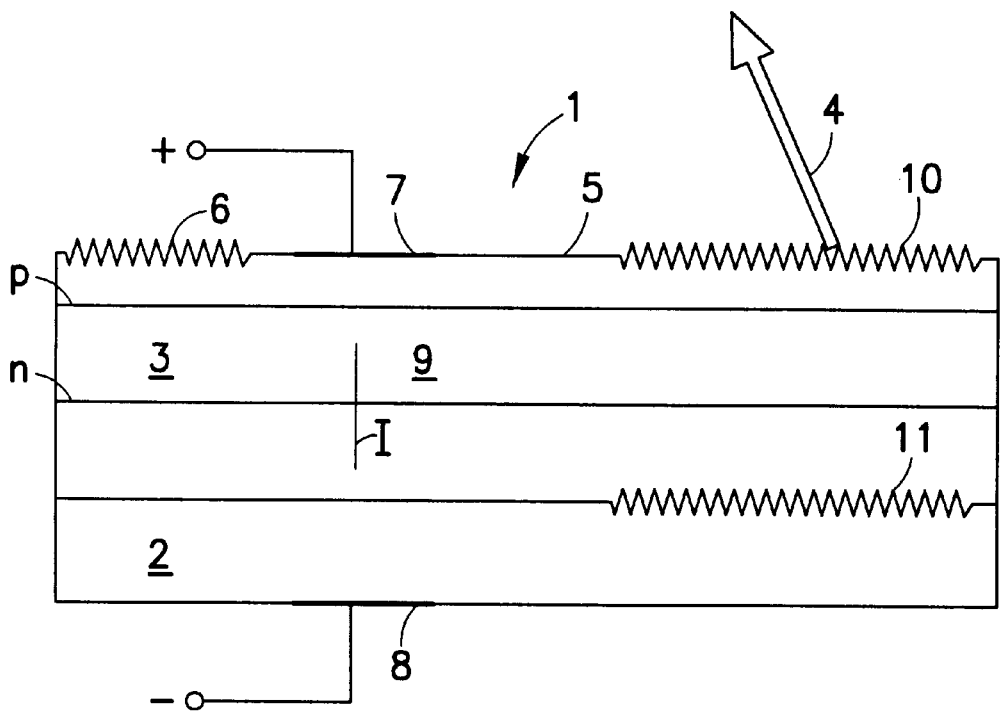
FIG. 1 is a sectional view of the laser diode of this invention.

As shown in FIG. 1, a laser diode 1 is constructed having a substrate 2 on which is applied a series of layers which include a p material of relatively low electron presence and an n material having a relative high electron presence. The p and n layers define an active layer 3 at their interface. A current flow I pumps the electrons across the interface. The resulting interaction produces a population inversion which generates energy in the form of photons within the active layer 3. These photons combine to form a laser beam 4 transmitted from the surface 5 of the diode 1. Current I is generated by applying a potential across contacts 7 and 8. The region of current flow defines a laser cavity 9 within the active layer 3.

In order to control the photons within the active layer 3 a first grating 6 is constructed having high reflectivity. Grating 6 reflects the photon energy into the laser cavity 9 and is constructed adjacent to the active layer 3. It is a periodic grating that produces optical feedback along the length of the laser cavity 9. This feedback process selects the wavelength of the light energy that oscillates in the laser cavity 9. Since energy not reflected is lost and reduces efficiency, the grating 6 is designed for high reflectivity which approaches 100%.

An output grating 10 is constructed having a lower reflectivity to allow the transmission of first order light energy out of laser cavity 9 at surface 5. The light output beam 4 is transmitted transverse to the plane of active surface 3. Grating 10 is designed to distribute the output beam 4 over the surface of the grating 10. The relatively large output area provides a wide output aperture and reduces beam divergence. A reflectivity of the output grating 10 of 30% or less will distribute sufficient feedback of energy back to the laser cavity 9 while allowing the required energy output at the grating 10. The feedback contributes to the sustaining of the population inversion.

A supplemental reflective element 11 is constructed opposite to the output grating 10 to increase the output efficiency of cavity 9 and to a lesser extent provide further distributed feedback. Although the element 11 may be any medium having a high reflectivity, it is constructed as a Bragg- Reflector in the preferred embodiment to maximize efficiency. Reflector 11 is positioned in the diode a predetermined distance d from the output grating 10. The distance d is selected to insure that the reflected wave $A^1$ is in phase with the output wave $A^0$. This phase matching provides enhanced efficiency for the laser performance. The placement of the reflector 11 under the active layer 3 limits diffraction of radiation into the substrate 2 and generates additional distributed feedback of energy into the laser cavity 9. This feedback is used to enhance the output by matching the second order Bragg reflection with the phase of the first order light output. Recognizing the fact that the first order light output is diffracted in air, the laser generation process of the diode laser of this invention will improve the output power available. For example in a typical Galium Arsanide diode the different index of refraction between air and the diode will reflect 70% of the emitted light. This light would otherwise be absorbed in the substrate. The process of this invention may be further explained through the calculations described below.

High power signal mode semiconductor lasers are highly desired for a variety of applications (for example, Er-doped optical fiber pumping). Increasing the laser diode output power causes two main problems, however: heating and the catastrophic degradation of the output facet. In principle, these problems can be overcome through both improved laser efficiency and enlargement of the output facet area. Unfortunately it is difficult to implement these improvements using conventional semiconductor laser designs.

As a result, we propose a phase-matched grating coupled surface emitting laser construction which simultaneously provides:

1) Single mode operation due to distributed feedback.
2) Distributed output, which eliminates "catastrophic" degradation of the output facet
3) High laser efficiency due to the low radiation losses provided by phase matching of the reflectance in the output grating and the distributed Bragg reflector.

Grating coupled surface emitting semiconductor lasers (GCSEL) have many advantages compared with common edge emitting devices which emit through the facets. One of the main advantages of such lasers is the large emitting surface of the output aperture. This results not only in low output beam divergence but also in lifting the fundamental limit for laser output power set by the 'catastrophic' degradation of the laser facets. The use of diffraction gratings for feedback and radiation output also allows one to get single mode laser generation with narrow linewidth.

The main disadvantage of typical GCSELs is the significant decrease of the laser efficiency due to diffraction of radiation back into substrate. It should also be noted that it is also common to employ second order gratings for feedback in these devices. In this case the laser efficiency is also lowered by radiation loses in the first order of diffraction.

Both of these problems can be solved by placing a Bragg reflector (BR) under the waveguide layer, however. In spite of the apparent simplicity of this approach, many authors have neglected the phase relations between the wave diffracted directly in air and the wave diffracted into substrate and reflected by the BR. In this paper this phase relation is rigorously calculated and analyzed to determine its impact on possible diode laser construction.

Figure 2:
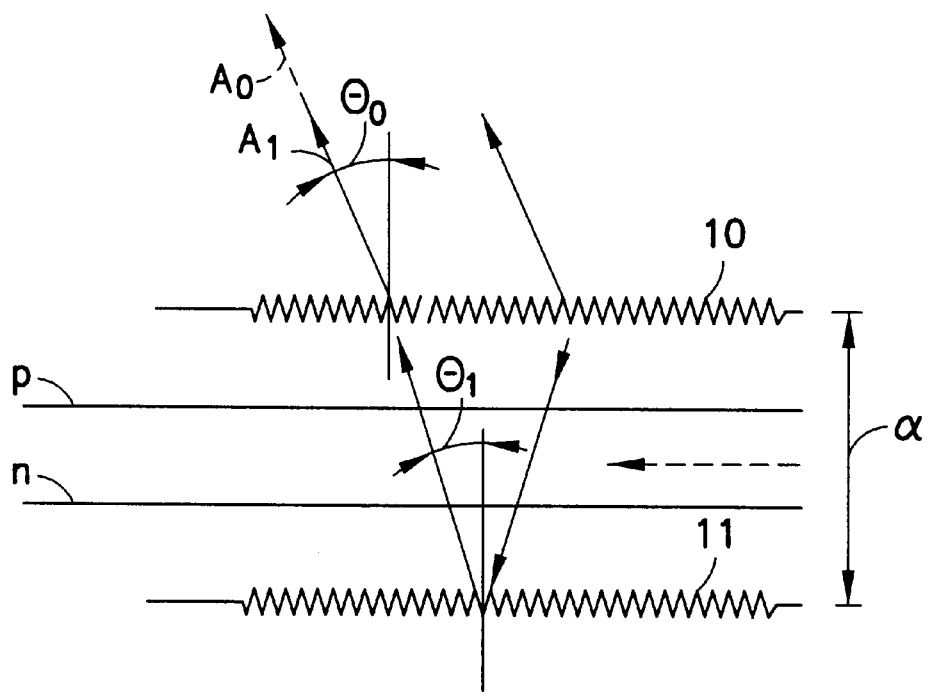
FIG. 2 is a sectional view of a portion of the laser diode of this invention showing the relation between the reflective grating and the output grating.

Let us consider the diffraction of the waveguide mode on the surface grating. The wave diffracted at an angle $\theta_0$ is the superposition of two waves (FIG. 2). The first is diffracted directly in air at an angle $\theta 0$ with amplitude $A^0$, and the second is diffracted into the substrate at an the angle $\theta 1$ and reflected by the bragg reflector 11 with resulting amplitude $A^1$. Back diffraction is considered using the corresponding 'negative' diffraction angles.

The phase difference $\Delta\phi 01$ between these two waves is just, referring to FIG. 2, $$\Delta\varphi_{01} = 2dN_m K_0 \sin\theta_1 + 2d\bar{n}K_0 \frac{1}{\cos\theta_1} + \Delta\varphi_0(\theta_1)$$

where $N_m$ is the effective refractive index for waveguide mode, n, the 'average' refractive index for the waveguide and cladding layers, d, the distance from the grating to the Bragg Reflector, $K_0$, the wave vector of the light in vacuum, and $\Delta\phi 01$ is the phase of the reflection from the Bragg Reflector.

When $\theta_1 \approx 0$, this phase difference can be written as:

$$\Delta\phi_1 = 2d\bar{n}K_0$$

Figure 3:
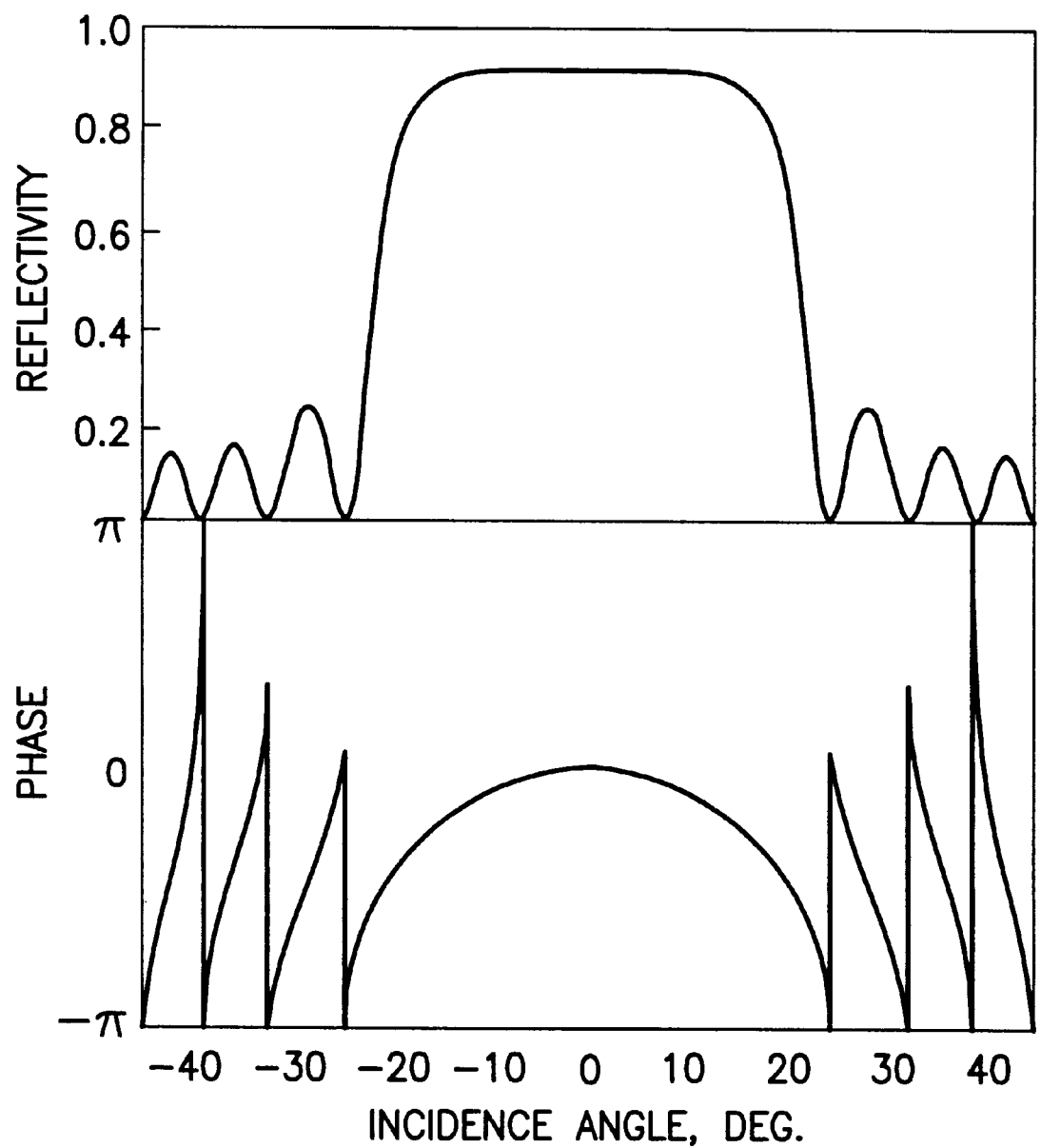
FIG. 3 is a graph showing the correlation between the phase and reflectivity of the reflector of this invention.

FIG. 3 shows that the frequency of the Bragg interference on the Bragg Reflector phase $\Delta\phi$ depends slightly on the angle $\theta$. At the Bragg frequency, where $\theta 1=0$, this phase difference will be equal to either 0 or $\pi$ depending on the order of layer alternation in the Bragg Reflector.

The resulting intensity $I=|A_0+A_1|^2$ depends on the difference of the phases of waves $A^0$ and $A^1$. In other words, the Bragg Reflector can either increase or suppress the diffraction output.

It is important to note that the wave incident to the surface grating is diffracted partly in air, in the waveguide mode and on the Bragg Reflector. This should make it possible to construct a high-efficiency second order distributed Bragg Reflector laser diode with diffraction output through a first order surface grating, and to use the monolithic epitaxial structure with multilayer Bragg Reflector to both increase the diffraction output and suppress the first order diffraction in air of the distributed Bragg Reflector.

In this case, the step of the surface grating used for feedback can be written as:

$$a_1 = \frac{2 \cdot \pi}{N_m \cdot K_0}$$

with the period of the grating used for diffraction output given by:

$$\frac{\pi}{N_m \cdot K_0} < a_2 < \frac{2 \cdot \pi}{N_m \cdot K_0}$$

In order to suppress the radiation losses in the first order of the distributed Bragg Reflector and, at the same time, enhance the output through the other surface grating the phase increment of the normally diffracted wave must differ from the one diffracted at the angle $\theta 1$ by $2m+1)\pi$, where m is integer. Using the relationships given above, this condition can be rewritten as:

$$2dN_m K_0 \sin\theta_1 + 2d\bar{n}K_0\left(\frac{1}{\cos\theta_1} - 1\right) + \Delta\varphi_b(\theta_1) - \Delta\varphi_b(0) = (2m+1)\pi$$

Note that when $\theta 1$ is small, only the first term above is significant. Therefore, when $m=0.N_m \approx \bar{n}$, this can be transformed to:

$$d \approx \frac{\lambda}{4 \cdot \sin\theta_1}$$

where $\lambda$ is wavelength of light in material. In other words, for an angle $\theta_1=5°$ the waveguide thickness d is about 2.5 times the wavelength of light in the material. For a GaAs/AlGaAs laser ($\lambda=0.9$ μm, $N_m \approx \bar{n} \approx 3.5$ the output angle is $\theta_m \approx 20°$ and the angle of diffraction into substrate is $\theta_1 \approx 5°$. In this case radiation losses and output efficiency can be maximized when d=0.6 μm.

It should also be noted that the simultaneous enhancement of radiation through the "output" grating (OG) and suppression of the radiation losses in the Distributed Bragg Reflector allows one to obtain very high laser efficiency. Here the laser efficiency $\eta$ is given by $$\eta = \eta_1 \frac{\eta_{out}}{\eta_{out} + \alpha_{int}}$$

where $\eta_1$—is the internal efficiency, $\eta_{out}$—is the internal losses and $\eta_{int}$—is the losses for output. This last expression can be written as:

$$\eta_{out} = \frac{1}{2L} \ln \frac{1}{R_{DBR} R_{out}}$$

where L—is the length of active region, $R_{DBR}$ the reflectance of the Bragg Reflector and $R_{out}$ the reflectance of the output grating (OG). This last parameter is determined primarily by the discontinuity in the refractive index at the air/OG interface and can BE substantially reduced by appropriate laser diode construction. For MQW GaAs/AlGaAs laser diodes $\eta_1 \approx 1$, and $\alpha_{int} \approx 20 \div 30$ cm$^{-1}$. Assuming $R_{DBR} \approx 1$ and $R_{out} \approx 10^{-4}$ we find that for $\eta \approx 0.5$ one can obtain L$\approx$2 mm. At least in principle, then, this laser design can create very high output efficiencies even with large active areas.

Another goal for these devices is to obtain single mode generation. The condition of single mode operation can be written as:

$$\Delta\lambda_{DBR} \langle \Delta\lambda_{FP}$$

where $\Delta\lambda_{FP}$ is the mode spacing for Fabry-Perot resonator:

$$\Delta\lambda_{DBR} = \frac{\lambda_0^2 N}{2L}$$

and $\Delta\lambda_{DBR}$ is the reflectance bandwidth of distributed Brag reflector:

$$\Delta\lambda_{DBR} = \frac{k}{\pi} N \lambda_0^2$$

Here $\kappa$ is a coupling coefficient and $\lambda_0$ is wavelength of light in vacuum. From the expressions above one can obtain:

$$k < \frac{\pi}{2L}$$

Therefore to satisfy the condition $\kappa_{LDBR} \approx 1$ the length of distributed Bragg reflector $L_{DBR}$ is given by:

$$L_{DBR} > \frac{2}{\pi} L$$

For the of a MQW GaAs/AlGaAs laser diode with L=2 mm, $L_{DBR}$>1.3 mm.

In this manner an efficient high output surface emitting laser diode is constructed.

We claim:

1. A semiconductor diode having a planar shape with flat outer surfaces and a narrow edge, said diode constructed to generate a laser beam upon the application of an electric potential comprising:

a first layer constructed of a substrate material;

a second layer applied to the first layer and constructed of a material whose atomic structure is characterized by the presence of an excess of electrons;

a third layer applied to the second layer and constructed of a material whose atomic structure is characterized by a relative absence of electrons, the interface of said second and third layers forming an active layer in which energy is generated in the form of photons by the migration of electrons from said second layer to said third layer upon the application of the electric potential;

a first grating having a high reflectivity constructed adjacent to the active layer in an outer surface to provide distributed feedback of energy back to the active layer;

a second grating constructed in said outer surface adjacent to the active layer and having a relatively lower reflectivity compared to said first grating to provide for the release of first order output energy through said outer surface, said output energy being distributed over the second grating, said second grating having a reflectivity to distribute energy feedback to the active layer;

a reflective element constructed adjacent to the active layer opposite to the second grating to provide distributed energy feed back to the active layer and to provide a second order output energy to the second grating; said reflective element being positioned such that the second order energy is matched in phase with the first order output.

2. A semiconductor diode having a planar shape with a flat outer surface and a narrow edge, constructed to generate a laser beam upon the application of an electric potential, as described in claim 1 wherein the reflective element is a distributed Bragg-Reflector.

* * * * *

UNITED STATES PATENT AND TRADEMARK OFFICE
CERTIFICATE OF CORRECTION

PATENT NO. : 6,219,369 B1  
DATED : April 17, 2001  
INVENTOR(S) : Efim L. Portnoi et al.

Page 1 of 1

It is certified that error appears in the above-identified patent and that said Letters Patent is hereby corrected as shown below:

Title page,
Column 1, insert item [73]

Assignee: Laserfare Advanced Technology Group
Narragansett, RI (US)

Signed and Sealed this

Twentieth Day of November, 2001

Attest:

NICHOLAS P. GODICI
*Acting Director of the United States Patent and Trademark Office*

*Attesting Officer*

UNITED STATES PATENT AND TRADEMARK OFFICE
CERTIFICATE OF CORRECTION

PATENT NO.   : 6,219,369 B1
DATED        : April 17, 2001
INVENTOR(S)  : Efim L. Portnoi et al.

It is certified that error appears in the above-identified patent and that said Letters Patent is hereby corrected as shown below:

Column 1,
Line 5, insert,
-- This invention was made with Government support under contract # F29601-97-C-0032 awarded by the Department of Air Force. The government has certain rights in the invention. --

Signed and Sealed this

Sixth Day of August, 2002

Attest:

Attesting Officer

JAMES E. ROGAN
*Director of the United States Patent and Trademark Office*